United States Patent
Ito et al.

(10) Patent No.: US 6,429,669 B1
(45) Date of Patent: Aug. 6, 2002

(54) TEMPERATURE-INSENSITIVE ELECTRO-OPTIC PROBE

(75) Inventors: Akishige Ito; Katsushi Ohta; Toshiyuki Yagi, all of Tokyo; Mitsuru Shinagawa, Isehara; Tadao Nagatsuma, Sagamihara; Hakaru Kyuragi, Machida, all of (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/620,066

(22) Filed: Jul. 20, 2000

(30) Foreign Application Priority Data

Jul. 21, 1999 (JP) ............................................. 11-206876
Sep. 28, 1999 (JP) ............................................. 11-275389

(51) Int. Cl.$^7$ ........................................... G01R 31/308
(52) U.S. Cl. .......................... 324/753; 324/96; 324/750; 356/368; 250/225
(58) Field of Search .......................... 324/96, 570, 753, 324/752, 244.1, 750, 260, 512, 522; 359/245, 251; 356/364, 368; 350/96.15; 250/225, 227.14; 455/612

(56) References Cited

U.S. PATENT DOCUMENTS

| | | | |
|---|---|---|---|
| 5,808,473 A | 9/1998 | Shinagawa et al. | |
| 6,288,531 B1 * | 9/2001 | Ito | 324/96 |
| 6,297,650 B1 * | 10/2001 | Ito | 324/753 |
| 6,297,651 B1 * | 10/2001 | Akjuni | 324/753 |

FOREIGN PATENT DOCUMENTS

| | | |
|---|---|---|
| DE | 197 16477 A1 | 9/1998 |
| JP | 11174089 A | 7/1999 |

* cited by examiner

Primary Examiner—Michael J. Sherry
Assistant Examiner—Trung Nguyen
(74) Attorney, Agent, or Firm—Burns, Doane, Swecker & Mathis L.L.P.

(57) ABSTRACT

In order to maintain accuracy of measurement, a temperature-insensitive electro-optic probe has a laser diode provided to emit a laser beam based on a control signal of an oscilloscope body, a collimator lens provided to convert the laser beam into a parallel beam; an electro-optic element having on an end face thereof a reflective coating, with the optical characteristics which are changed by propagating an electrical field via a metal pin provided at the end face on the reflective coating side, an isolator provided between the collimator lens and the electro-optic element, and adapted to transmit the laser beam emitted from the laser diode, in order to separate a light reflected by the reflective coating from the laser beam, a photodiode provided to convert the reflected light separated by the isolator into an electrical signal, a temperature detection section arranged to be in contact with optical components consisting the isolator, and to detect the temperature of the optical components and output the result of the detection, a temperature adjustment section arranged to be in contact with the laser diode, and to adjust the temperature of the laser diode based on the result of the temperature detection, and a temperature control unit provided to control the temperature adjustment section based on the result of the temperature detection.

24 Claims, 5 Drawing Sheets

TEMPERATURE-INSENSITIVE ELECTRO-OPTIC PROBE

BACKGROUND OF THE INVENTION

1. Field of the Invention

The present invention relates to an electro-optic probe adapted to couple an electrical field generated by a measurement signal with an electro-optic crystal, when a beam of light is incident onto this electro-optic crystal, the waveform of the measurement signal can be observed by the polarization state of the incident light. More particularly, the present invention relates to an electro-optic probe having an improved optical system therein.

This application is based on Japanese Patent Application No. Hei 11-206876, and No. Hei 11-275389 the content of which is incorporated herein by reference.

2. Description of the Related Art

It is possible to couple an electrical field generated by a measurement signal with an electro-optic crystal, allow a laser beam to be incident into this electro-optic crystal, and observe the waveform of the measurement signal by the polarization state of the laser beam. It is possible to convert the laser beam to a pulse-shaped laser beam, and make observations with an extremely high time resolution when sampling the measurement signal. A device that does this is an electro-optic sampling oscilloscope that uses the electro-optic probe exploiting this phenomenon.

When this electro-optic sampling oscilloscope (hereinbelow, referred to as an "EOS oscilloscope") is compared to a conventional sampling oscilloscope using an electrical probe, the following characteristics are notable:

1. It is easy to measure the signal because a ground wire is unnecessary.
2. Because the metal pin at the tip of the electro-optic probe is insulated from the circuit system, it is possible to realize a high input impedance. As a result of this, there is almost no degradation of the state of the measurement signal.
3. By using an optical pulse, broadband measurement up to the GHz order is possible.

Figure 7:
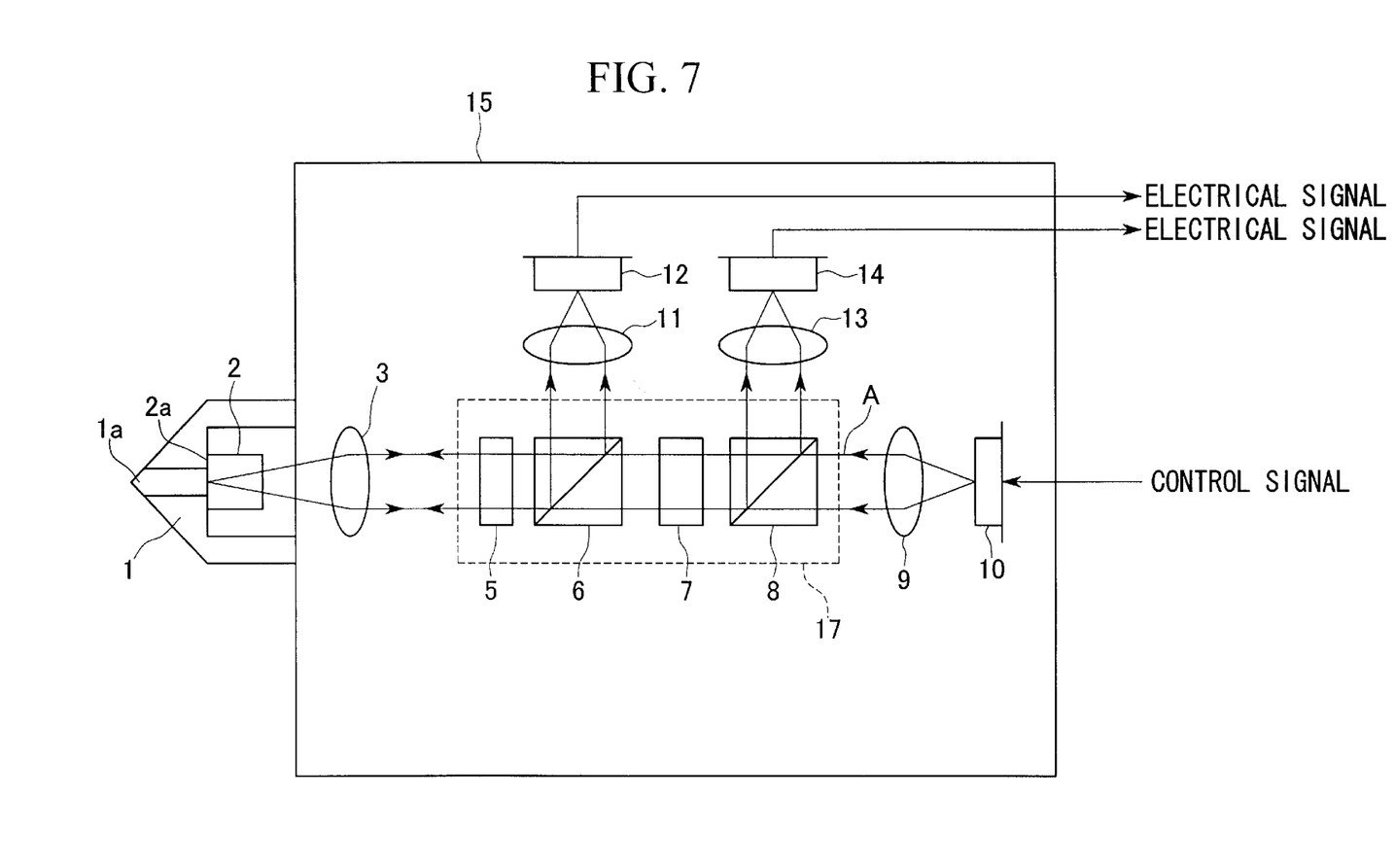
FIG. 7 is a constitutional view showing the configuration of an optical system of a conventional electro-optic probe.

The structure of an electro-optic probe in the conventional technology will be explained using FIG. 7. In FIG. 7, reference numeral 1 denotes a probe head composed of an insulator, and a metallic pin la is fitted in the center thereof. Reference numeral 2 denotes an electro-optic element, which includes a reflective coating 2a provided on an end surface on the metallic pin 1a side, and which is in contact with the metallic pin 1a. Reference numerals 3 and 9 denote collimator lenses. Reference numeral 5 denotes a 1/4 wavelength plate. Reference numerals 6 and 8 denote polarizing beam splitters. Reference numeral 7 denotes a Faraday element. Reference numeral 10 denotes a laser diode provided to emit a laser beam in response to a pulse signal outputted from an EOS oscilloscope body (not shown).

Reference numerals 11 and 13 denote condensing lenses, and reference numerals 12 and 14 denote photodiodes provided to convert the input laser beam into an electrical signal and output the signal to the EOS oscilloscope body. Reference numeral 15 denotes a probe body. Reference numeral 17 denotes an isolator comprising the 1/4 wave plate 5, the two polarizing beam splitters 6 and 8, and the Faraday element 7, for passing light output from the laser diode 10 and isolating the light reflected by the reflective coating 2a.

Next, referring to FIG. 7, the optical path of the laser light emitted from the laser diode 10 will be explained. In FIG. 7, a reference code A denotes the optical path of the laser beam.

First, the laser beam emitted from the laser diode 10 is converted by the collimator lens 9 into a parallel beam. This parallel beam travels straight through the polarized beam splitter 8, the Faraday element 7 and the polarized beam splitter 6, and then passes through the 1/4 wavelength plate 5 to be condensed by the collimator lens 3, and is incident onto the electro-optic element 2. The incident light is reflected by the reflective coating 2a formed on the end surface of the electro-optic element 2 on the side facing the metallic pin 1a.

Then, the reflected laser beam is again converted into a parallel beam by the collimator lens 3, and travels through the 1/4 wavelength plate 5. A part of the laser beam is reflected by polarized beam splitter 6, condensed by the condensing lens 11, and is incident onto the photodiode 12. The laser beam that has traveled through the polarized beam splitter 6 is reflected by the polarized beam splitter 8, condensed by the condensing lens 13, and is incident onto the photodiode 14.

The 1/4 wavelength plate 5 serves to adjust the laser beams incident on the photodiodes 12 and 13 such that intensities thereof are uniform.

Next, using the electro-optic probe shown in FIG. 7, the procedure for measuring the measurement signal is explained.

When the metallic pin 1a is placed in contact with a measurement point, at the electro-optic element 2, the electrical field is propagated to the electro-optic element 2 by a voltage applied to the metallic pin 1a, resulting in the phenomenon that the refractive index is changed due to the Pockels effect. Accordingly, the laser beam emitted from the laser diode 10 is incident onto the electro-optic element 2 and, when the laser beam is propagated along the electro-optic element 2, the polarization state of the beam changes. Then, the laser beam having this changed polarization state is reflected by the reflective coating 2a, condensed and is incident onto the photodiodes 12 and 14, and converted into an electrical signal.

The change in polarization caused by the electro-optic element 2, accompanying a change in voltage of the measurement point, results in a difference in the output from the photodiodes 12 and 14, and by detecting this difference it is possible to measure the electrical signal applied to the metal pin 1a.

In the above-described electro-optic probe, the electrical signals obtained from the photodiodes 12 and 14 are input into the EOS oscilloscope, and processed. Instead, however, it is possible to measure the signals by connecting a conventional measuring device such as a real time oscilloscope to the photodiodes 12 and 14 via a dedicated controller. In this way, it is possible to carry out broadband measurement simply by using the electro-optic probe.

The electro-optic probe as shown in FIG. 7 uses internal optical components. These optical components have the characteristic that when the temperatures of the components changes, their refractive indexes change. The change in the refractive index directly leads to a measurement error. It is therefore preferred that the optical components are maintained at the same temperature as that at the time of probe calibration.

However, since an operator must hold the electro-optic probe shown in FIG. 7 for use, it is difficult to maintain constant the temperature at which the probe is used. The change in an ambient temperature also brings about changes in the temperatures of the components constituting the probe, which in turn reduces the accuracy of measurement.

SUMMARY OF THE INVENTION

In consideration of the above-described situation, it is an object of the present invention to provide an electro-optic probe capable of maintaining a constant accuracy of measurement even if there is a change in temperature.

In order to achieve this object, the electro-optic probe of the invention comprises:

a laser diode provided to emit a laser beam based on a control signal of an oscilloscope body;
   a collimator lens provided to convert the laser beam into a parallel beam;
   an electro-optic element having on an end face thereof a reflective coating, with optical characteristics which are changed by propagating an electrical field via a metal pin provided at the end face on the reflective coating side;
   an isolator provided between the collimator lens and the electro-optic element, and adapted to transmit the laser beam emitted from the laser diode in order to separate a light reflected by the reflective coating from the laser beam; and
   a photodiode provided to convert the reflected light separated by the isolator into an electrical signal;
   wherein the electro-optic probe includes:
      a temperature detection section arranged to be in contact with optical components constituting the isolator, and to detect the temperature of the optical components and output the result of the detection;
      a temperature adjustment section arranged to be in contact with the laser diode, and to adjust the temperature of the laser diode according to the result of the temperature detection; and
      a temperature control unit provided to control the temperature adjustment section based on the result of the temperature detection.

As described above, according to the invention, the temperature detection section is provided so as to be in contact with the optical components constituting the isolator, and the temperature adjustment section is provided to adjust the temperature of the laser diode based on the detection result of the temperature detection section. Therefore, it is possible to maintain constant S/N all the time, and it is also possible to prevent the accuracy of measurement from decreasing due to a temperature change.

The reference numerals appended in the claims do not limit the interpretation of the claims.

BRIEF DESCRIPTION OF THE DRAWINGS

For a more complete understanding of the present invention and the advantages thereof, reference is now made to the following description taken in conjunction with the accompanying drawings, in which.

DESCRIPTION OF THE PREFERRED EMBODIMENTS

It should be understood that the embodiment described hereinbelow does not limit the present invention specified in appended claims. It should also be understood that all the combinations of the features explained with reference to the embodiment are not always necessary in order to achieve the object of the invention.

An electro-optic probe of an embodiment of the invention will now be explained with reference to the accompanying drawings.

Figure 1:
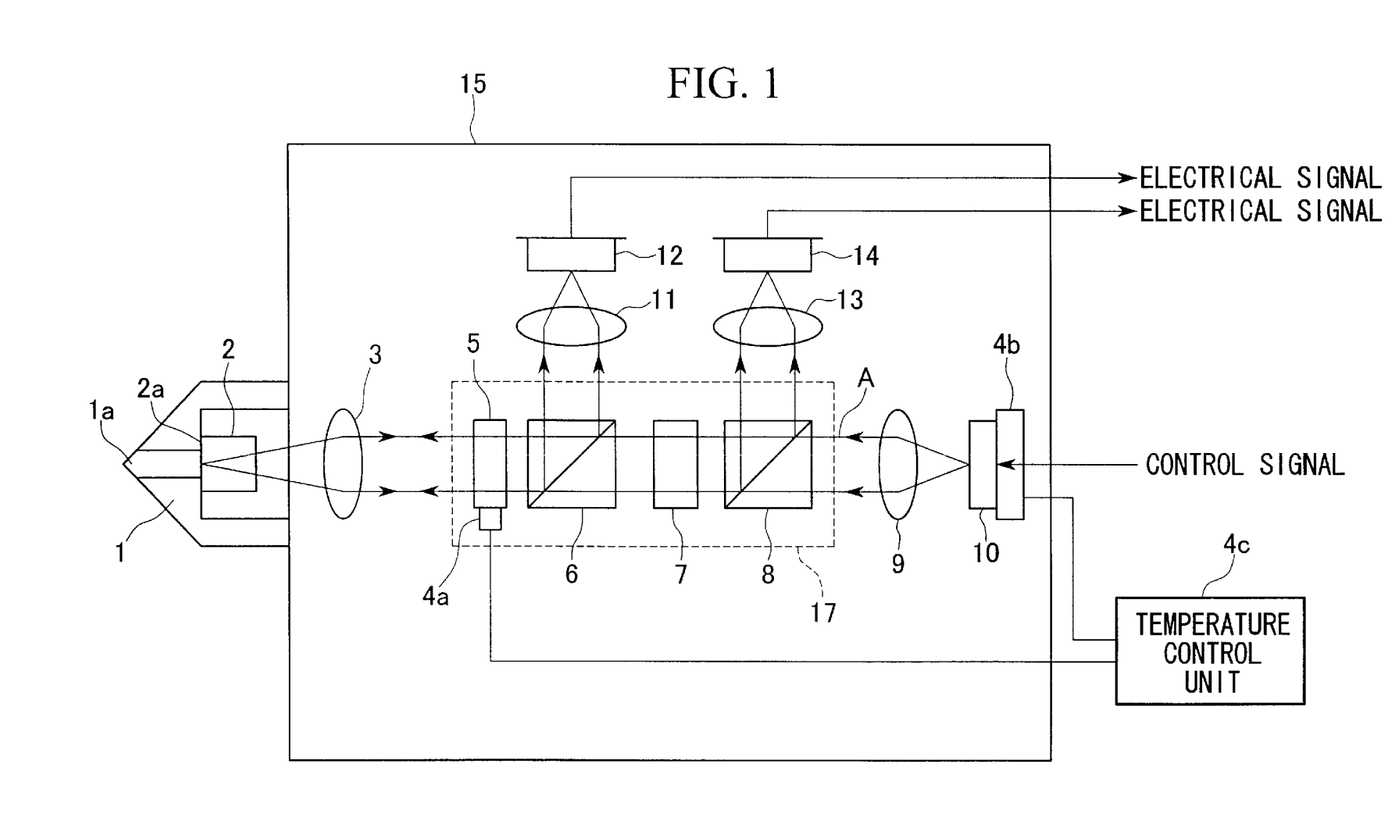
FIG. 1 is a constitutional view showing the configuration of an optical system according to an embodiment of the invention.

FIG. 1 shows a configuration of the embodiment. In FIG. 1, portions the same as those of the conventional probe shown in FIG. 7 are denoted by the same reference numerals, and explanations thereof will be omitted. The electro-optic probe of the drawing is different from the conventional probe in that a temperature detection section 4a is provided so as to be in contact with the 1/4 wavelength plate 5, a temperature adjustment section 4b is provided so as to be in contact with the laser diode 10, and a temperature control unit 4c is provided outside the electro-optic probe (hereinafter, simply referred to as a probe).

The temperature detection section 4a shown in FIG. 1 is composed of a thermistor or the like, and is secured to the probe body 15 in contact with the 1/4 wavelength plate 5. The temperature adjustment section 4b is composed of a Peltier element or the like, and is secured to the probe body 15 in contact with the laser diode 10. The temperature detection section 4a and the temperature adjustment section 4b are respectively connected to the temperature control unit 4c provided outside the probe body 15.

Optical components constituting the isolator 17 may be secured by using a material having good thermal conductivity, and the temperature detection section 4a may be provided in this isolator 17.

Figure 2:
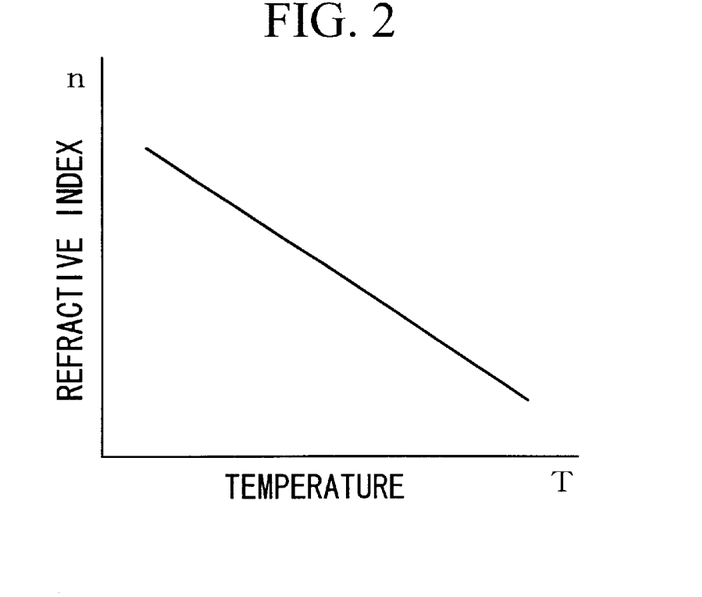
FIG. 2 is a view showing the temperature characteristics of the 1/4 wavelength plate 5 used in a probe.

Next, a principle for improving measurement accuracy is explained with reference to FIGS. 2 to 5. FIG. 2 shows the temperature characteristics of the 1/4 wavelength plate 5 used inside the probe. In FIG. 2, the X axis represents the temperature of the 1/4 wavelength plate 5, and the Y axis represents the refractive index thereof. As can be understood from FIG. 2, the 1/4 wavelength plate 5 has the characteristic that, as the temperature becomes higher, the refractive index becomes smaller.

Figure 3:
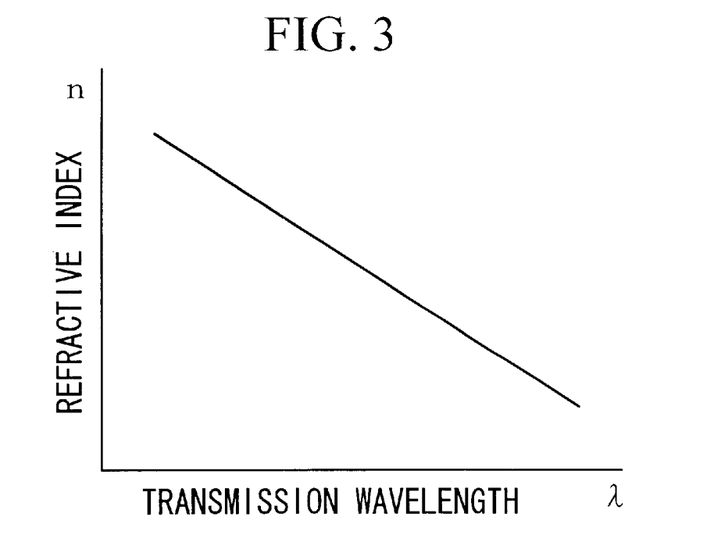
FIG. 3 is a view showing the relationship between the refractive index and the transmission wavelength at the 1/4 wavelength plate 5.

FIG. 3 shows the relationship between the refractive index and the transmission wavelength of the 1/4 wavelength plate 5. In FIG. 3, the X axis represents the transmission wavelength of the 1/4 wavelength plate 5, and the Y axis represents the refractive index thereof. As can be understood from FIG. 3, the 1/4 wavelength plate 5 has the characteristic that as the refractive index becomes smaller, the transmission wavelength becomes longer. In this case, the transmission wavelength means the light wavelength inside the 1/4 wavelength plate 5. In other words, a smaller refractive index results in the occurrence of the phenomenon in which the wavelength of a light incident on the 1/4 wavelength plate 5 appears to be longer than it actually is.

Figure 4:
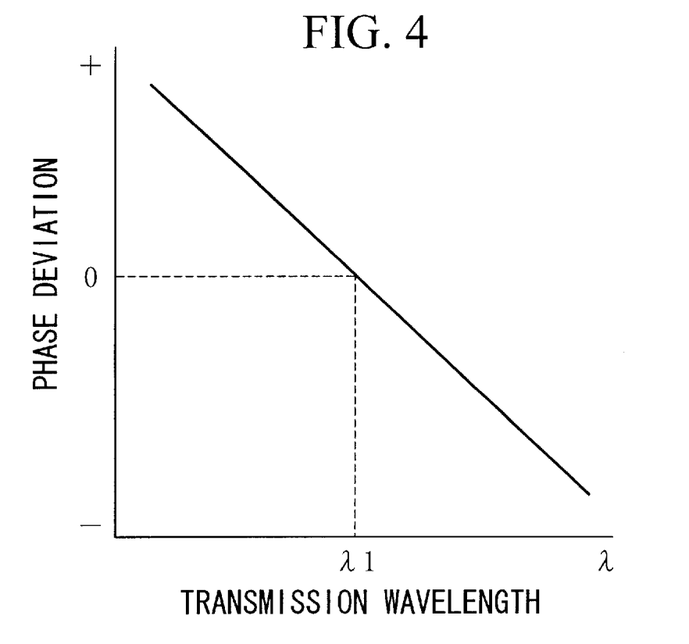
FIG. 4 is a view showing the relationship between a transmission wavelength and a phase deviation at the 1/4 wavelength plate 5.

FIG. 4 shows the relationship between the transmission wavelength of the 1/4 wavelength plate 5 and the phase deviation. In FIG. 4, the X axis represents the transmission wavelength of the 1/4 wavelength plate 5, and the Y axis represents the phase deviation. As can be understood from FIG. 4, assuming that the transmission wavelength is λ1 at the time of probe calibration, and the phase deviation is "0" at this time, then as the wavelength becomes longer, the phase deviates in the negative (−) direction. As the transmission wavelength becomes shorter, the phase deviates in a positive (+) direction.

As apparent from FIGS. 2 to 4, since the transmission wavelength of the 1/4 wavelength plate 5 becomes longer as the temperature thereof becomes higher, the phase deviates in the negative (−) direction. Such a phase deviation results in a degradation of the S/N ratio.

Figure 5:
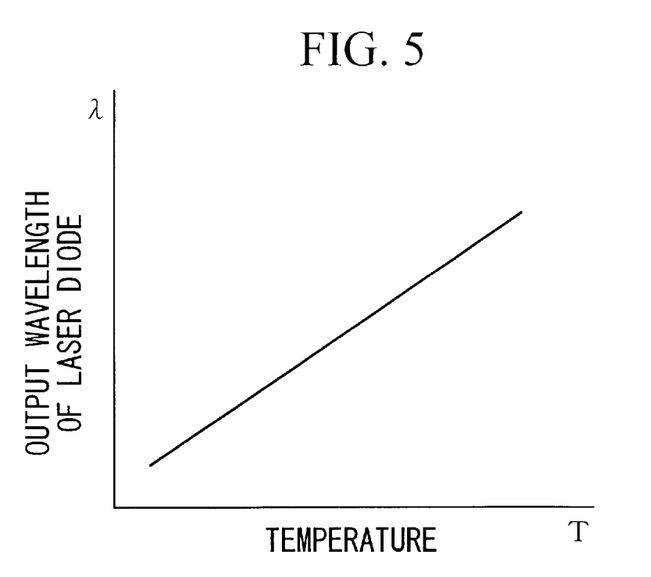
FIG. 5 is a view showing the temperature characteristics of a laser diode 10.

On the other hand, the wavelength of the light emitted by the laser diode 10 varies depending on the temperature of the laser diode 10 itself. FIG. 5 shows the temperature characteristics of the laser diode 10. In FIG. 5, the X axis represents the temperature of the laser diode 10, and the Y axis represents the output wavelength thereof. As can be understood from FIG. 5, the laser diode 10 has the characteristic that along with the temperature increase of the laser diode 10, the output wavelength becomes longer.

Because this characteristic, when the temperature of the optical components becomes higher, the refractive index thereof becomes smaller. This phenomenon is similar to the case that the wavelength of the light traveling through each optical component becomes longer. The invention is designed to cancel the effect of this phenomenon by reducing the temperature of the laser diode and shifting its output wavelength to the short wavelength side. If the temperature of the optical components is reduced, the output wavelength is shifted to the long-wavelength side by increasing the temperature of the laser diode. With the invention, it is possible to always obtain a constant measurement accuracy by performing control of the laser diode according to changes in the temperature of the optical components.

Figure 6:
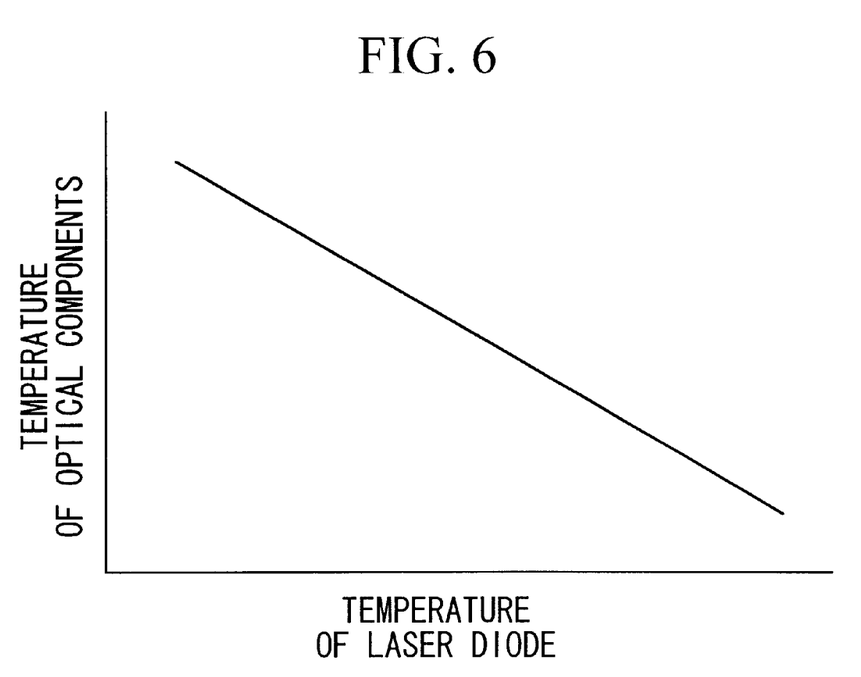
FIG. 6 is a view showing varies the temperature relationship between the optical components and the laser diode 10.

Next, the operation of changing the wavelength of the output light by performing temperature adjustment for the laser diode 10 is explained. First, as shown in FIG. 6, in the temperature control unit 4c, the temperature relationship between the optical components and the laser diode is stored beforehand. In FIG. 6, the X axis represents the temperature of the laser diode 10, and the Y axis represents the temperature of the optical components of the isolator 17, which is equivalent to the temperature of the 1/4 wavelength plate 5. As shown in the drawing, the target temperature of the laser diode 10 is defined according to the change in the temperature of the optical components. In this case, the target temperature means the temperature for obtaining the output wavelength of the laser diode 10 which cancels the change of the refractive index due to the temperature change of the optical components. Accordingly, the temperature control unit 4c performs a control so that the temperature of the laser diode 10 can be set equal to the target temperature, in response to the temperature of the optical components.

The temperature of the temperature detection section 4a becomes equal to that of the 1/4 wavelength plate 5, because the temperature detection section 4a is in contact with the 1/4 wavelength plate 5. Accordingly, an output result of this temperature detection section 4a is equivalent to the detected temperature of the 1/4 wavelength plate 5. The temperature control unit 4c receives this detected temperature as the detection result, obtains the above-described target temperature, and performs temperature adjustment for the laser diode 10 so as to set the temperature of the temperature adjustment section 4b equal to the target temperature.

At this time, if the temperature of the laser diode 10 is lower than the target temperature, the temperature control unit 4c controls the current supplied to the temperature adjustment section 4b in order to increase the temperature thereof. In turn, in the temperature adjustment section 4b, heat is generated by the Peltier effect, and this heat is conducted to the laser diode 10. As a result, the temperature of the laser diode 10 is increased.

On the other hand, if the temperature of the laser diode 10 is higher than the target temperature, the temperature control unit 4c controls the current supplied to the temperature adjustment section 4b in order to lower the temperature thereof. In turn, in the temperature adjustment section 4b, heat is absorbed by Peltier effect, resulting in a decreased temperature of the temperature adjustment section 4b. Because the laser diode 10 is in contact with the temperature adjustment section 4b, the heat of the laser diode 10 is also absorbed. As a result, the temperature of the laser diode 10 is lowered.

The temperature control unit 4c repeats the above-described current control operation, and controls the output wavelength by increasing or decreasing the temperature of the laser diode 10 based on the detection result of the temperature detection section 4a.

A description of the operation of measuring the measurement signal is omitted because of its similarity to the conventional operation.

As apparent from the foregoing, since the output wavelength is changed by controlling the temperature of the laser diode 10 based on the temperature of the optical components constituting the isolator 17, it is possible to measure the measurement signal with good accuracy.

The temperature control unit 4c may be adapted to display that temperature adjustment is being performed until the temperature of the laser diode 10 reaches the target temperature based on the result of the temperature detection section 4a. By referring to the displayed result, the operator can tell that temperature adjustment is on going, and thereby work in an appropriate manner.

The temperature control unit 4c may be incorporated in a not-shown oscilloscope body.

Furthermore, in the above-described embodiment, if a continuous beam of light is emitted from the laser diode 10, signal measurement by a conventional general measuring device such as a real time oscilloscope, a sampling oscilloscope, or a spectrum analyzer is possible. In this case, in place of the EOS oscilloscope, in the real time oscilloscope, the sampling oscilloscope or the spectrum analyzer may be connected to the photodiodes 12 and 14, via a dedicated controller.

Although the preferred embodiment of the present invention has been described in detail, it should be understood that various changes, substitutions and alternations can be made therein without departing from the spirit and scope of the inventions as defined by the appended claims.

What is claimed is:

1. An temperature-insensitive electro-optic probe in communication with an oscilloscope body comprising:

a metal pin provided at an end of the probe;

a laser diode for emitting a laser beam based on a control signal of the oscilloscope body;

a collimator lens for converting the laser beam into a parallel beam;

an electro-optic element having a reflective coating on an end face thereof, and having optical characteristics which are changed by propagating an electrical field via the metal pin provided at the end face;

an isolator provided between the collimator lens and the electro-optic element, comprising a 1/4 wave plate, two polarizing beam splitters, and a Faraday element, and adapted to transmit the laser beam emitted from the laser diode therethrough in order to separate a light reflected by the reflective coating from the laser beam;

a photo diode for converting the reflected light separated by the isolator into an electrical signal;

a temperature detection section arranged to be in contact with the 1/4 wave plate of the isolator, and to detect the temperature of the optical components and output the result of the detection;

a temperature adjustment section arranged to be in contact with the laser diode, and to adjust the temperature of the laser diode according to the result of the temperature detection; and a temperature control unit provided to control the temperature adjustment section based on the result of the temperature detection.

2. The electro-optic probe according to claim 1,
wherein said photodiode and said laser diode are connected to an electro-optic sampling oscilloscope, and
said laser diode generates the laser beam as a pulsed beam based on a control signal from the electro-optic sampling oscilloscope.

3. The electro-optic probe according to claim 2, wherein said temperature detection section is composed of a thermistor, and is adapted to detect the temperature of the optical components based on a change of a resistance value.

4. The electro-optic probe according to claim 3, wherein said temperature adjustment section is composed of a Peltier element, and is adapted to increase/decrease the temperature of the laser diode based on a change of a current.

5. The electro-optic probe according to claim 4, wherein said temperature control unit controls the temperature adjustment section to decrease the temperature of the laser diode when the temperature of the optical components is high, based on the detection result of the temperature detection section, and to increase the temperature of the laser diode when the temperature of the optical components is low.

6. The electro-optic probe according to claim 3, wherein said temperature control unit controls the temperature adjustment section to decrease the temperature of the laser diode when the temperature of the optical components is high, based on the detection result of the temperature detection section, and to increase the temperature of the laser diode when the temperature of the optical components is low.

7. The electro-optic probe according to claim 2, wherein said temperature adjustment section is composed of a Peltier element, and is adapted to increase/decrease the temperature of the laser diode based on a change of a current.

8. The electro-optic probe according to claim 7, wherein said temperature control unit controls the temperature adjustment section to decrease the temperature of the laser diode when the temperature of the optical components is high, based on the detection result of the temperature detection section, and to increase the temperature of the laser diode when the temperature of the optical components is low.

9. The electro-optic probe according to claim 2, wherein said temperature control unit controls the temperature adjustment section to decrease the temperature of the laser diode when the temperature of the optical components is high, based on the detection result of the temperature detection section, and to increase the temperature of the laser diode when the temperature of the optical components is low.

10. The electro-optic probe according to claim 1, wherein said laser diode generates the laser beam as a continuous beam of light.

11. The electro-optic probe according to claim 10, wherein said temperature detection section is composed of a thermistor, and is adapted to detect the temperature of the optical components based on a change of a resistance value.

12. The electro-optic probe according to claim 11, wherein said temperature adjustment section is composed of a Peltier element, and is adapted to increase/decrease the temperature of the laser diode based on a change of a current.

13. The electro-optic probe according to claim 12, wherein said temperature control unit controls the temperature adjustment section to decrease the temperature of the laser diode when the temperature of the optical components is high, based on the detection result of the temperature detection section, and to increase the temperature of the laser diode when the temperature of the optical components is low.

14. The electro-optic probe according to claim 11, wherein said temperature control unit controls the temperature adjustment section to decrease the temperature of the laser diode when the temperature of the optical components is high, based on the detection result of the temperature detection section, and to increase the temperature of the laser diode when the temperature of the optical components is low.

15. The electro-optic probe according to claim 10, wherein said temperature adjustment section is composed of a Peltier element, and is adapted to increase/decrease the temperature of the laser diode based on a change of a current.

16. The electro-optic probe according to claim 15, wherein said temperature control unit controls the temperature adjustment section to decrease the temperature of the laser diode when the temperature of the optical components is high, based on the detection result of the temperature detection section, and to increase the temperature of the laser diode when the temperature of the optical components is low.

17. The electro-optic probe according to claim 10, wherein said temperature control unit controls the temperature adjustment section to decrease the temperature of the laser diode when the temperature of the optical components is high, based on the detection result of the temperature detection section, and to increase the temperature of the laser diode when the temperature of the optical components is low.

18. The electro-optic probe according to claim 1, wherein said temperature detection section is composed of a thermistor, and is adapted to detect the temperature of the optical components based on a change of a resistance value.

19. The electro-optic probe according to claim 18, wherein said temperature adjustment section is composed of a Peltier element, and is adapted to increase/decrease the temperature of the laser diode based on a change of a current.

20. The electro-optic probe according to claim 19, wherein said temperature control unit controls the temperature adjustment section to decrease the temperature of the laser diode when the temperature of the optical components is high, based on the detection result of the temperature detection section, and to increase the temperature of the laser diode when the temperature of the optical components is low.

21. The electro-optic probe according to claim 18, wherein said temperature control unit controls the temperature adjustment section to decrease the temperature of the laser diode when the temperature of the optical components is high, based on the detection result of the temperature detection section, and to increase the temperature of the laser diode when the temperature of the optical components is low.

22. The electro-optic probe according to claim 1, wherein said temperature adjustment section is composed of a Peltier element, and is adapted to increase/decrease the temperature of the laser diode based on a change of a current.

23. The electro-optic probe according to claim 22, wherein said temperature control unit controls the temperature adjustment section to decrease the temperature of the laser diode when the temperature of the optical components is high, and to increase the temperature of the laser diode when the temperature of the optical components is low.

24. The electro-optic probe according to claim 1, wherein said temperature control unit controls the temperature adjustment section to decrease the temperature of the laser diode when the temperature of the optical components is high, based on the detection result of the temperature detection section, and to increase the temperature of the laser diode when the temperature of the optical components is low.

\* \* \* \* \*

UNITED STATES PATENT AND TRADEMARK OFFICE
CERTIFICATE OF CORRECTION

PATENT NO.    : 6,429,669 B1
DATED         : August 6, 2002
INVENTOR(S)   : Ito et al.

It is certified that error appears in the above-identified patent and that said Letters Patent is hereby corrected as shown below:

<u>Title page,</u>
Item [73], Assignee: insert -- Ando Electric Co., Ltd., Tokyo, Japan and Nippon Telegraph And Telephone Corporation, Tokyo, Japan --.

Signed and Sealed this

Sixth Day of May, 2003

JAMES E. ROGAN
*Director of the United States Patent and Trademark Office*